(12) United States Patent
Takizawa et al.

(10) Patent No.: US 8,068,345 B2
(45) Date of Patent: Nov. 29, 2011

(54) ELECTRONIC DEVICE

(75) Inventors: Minoru Takizawa, Sagamihara (JP); Hidenori Tanaka, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/704,736

(22) Filed: Feb. 12, 2010

(65) Prior Publication Data
US 2010/0328904 A1    Dec. 30, 2010

(30) Foreign Application Priority Data

Jun. 30, 2009   (JP) ................................ 2009-156000

(51) Int. Cl.
*H05K 5/00* (2006.01)

(52) U.S. Cl. ........ 361/752; 361/758; 361/790; 361/814; 361/816; 361/757

(58) Field of Classification Search .................. 174/758, 174/790, 752; 361/758, 790, 752, 814, 816, 361/757
See application file for complete search history.

(56) References Cited

U.S. PATENT DOCUMENTS

| | | | | |
|---|---|---|---|---|
| 5,499,444 | A | * | 3/1996 | Doane et al. .................... 29/830 |
| 6,483,037 | B1 | * | 11/2002 | Moore et al. .................. 174/254 |
| 6,498,307 | B2 | | 12/2002 | Ichihara et al. |
| 2001/0030057 | A1 | | 10/2001 | Ichihara et al. |
| 2004/0222510 | A1 | * | 11/2004 | Aoyagi .......................... 257/686 |
| 2009/0020317 | A1 | * | 1/2009 | Takahashi et al. ............. 174/254 |

FOREIGN PATENT DOCUMENTS

| | | |
|---|---|---|
| JP | 9-283865 | 10/1997 |
| JP | 10-189867 | 7/1998 |
| JP | 11-260957 | 9/1999 |
| JP | 2000-082868 | 3/2000 |
| JP | 2003-332743 | 11/2003 |
| JP | 2004-273583 | 9/2004 |
| JP | 2004-342888 | 12/2004 |
| JP | 2005-235997 | 9/2005 |

OTHER PUBLICATIONS

JP H10-189867 English translation.*

* cited by examiner

*Primary Examiner* — Tuan T Dinh
*Assistant Examiner* — Steven Sawyer
(74) *Attorney, Agent, or Firm* — Blakely, Sokoloff, Taylor & Zafman LLP

(57) ABSTRACT

According to one embodiment, an electronic device includes a housing, a first substrate having rigidity and including a slit, contained in the housing, a part mount portion provided on the first substrate and adjacent to the slit, an electronic part mounted on the part mount portion and a second substrate having flexibility. The second substrate is stacked on an inside of the first substrate and an inside of the part mount portion, and it crosses the slit, thereby supporting the part mount portion to be displaceable with respect to the first substrate.

2 Claims, 6 Drawing Sheets

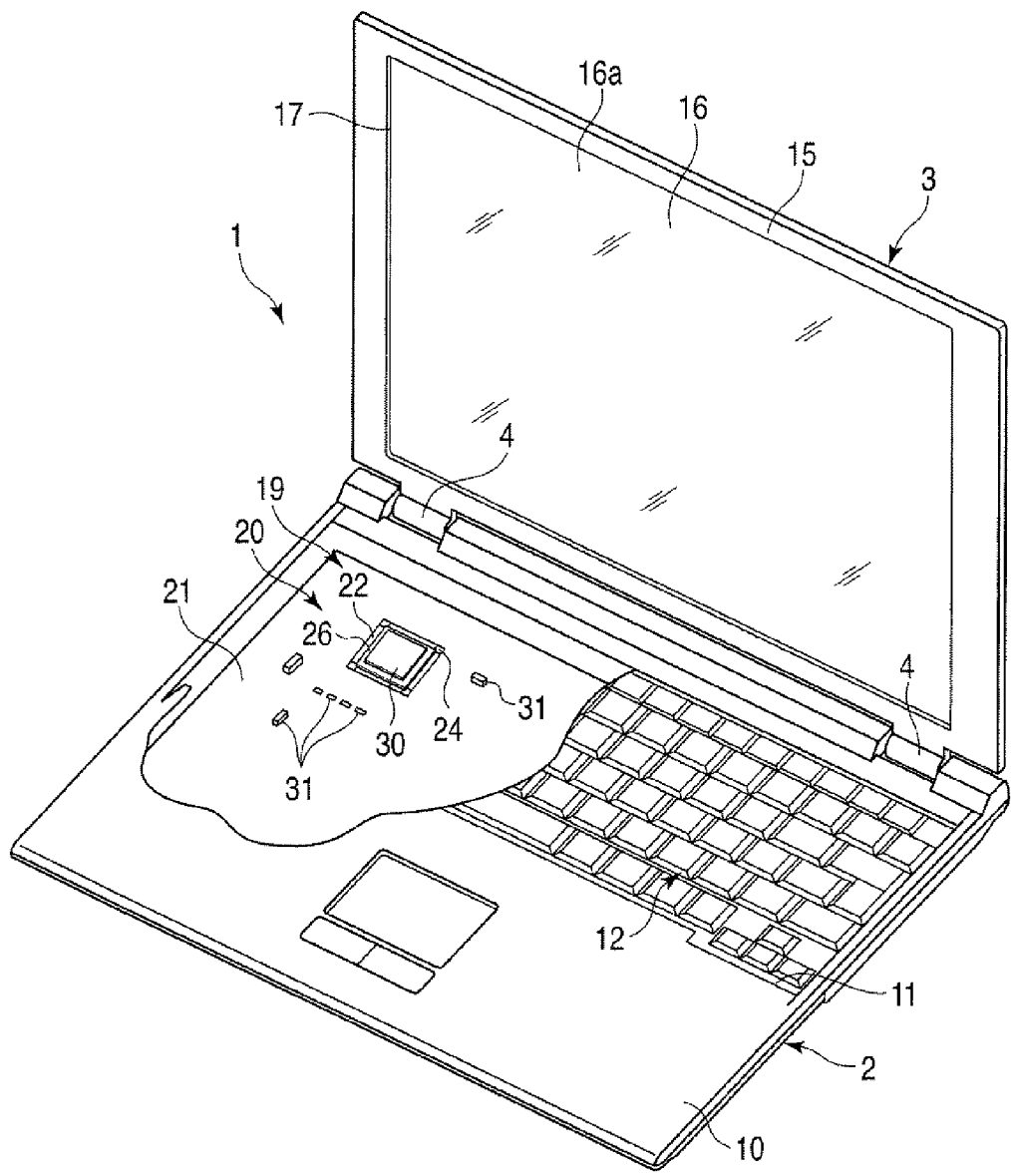
F I G. 1

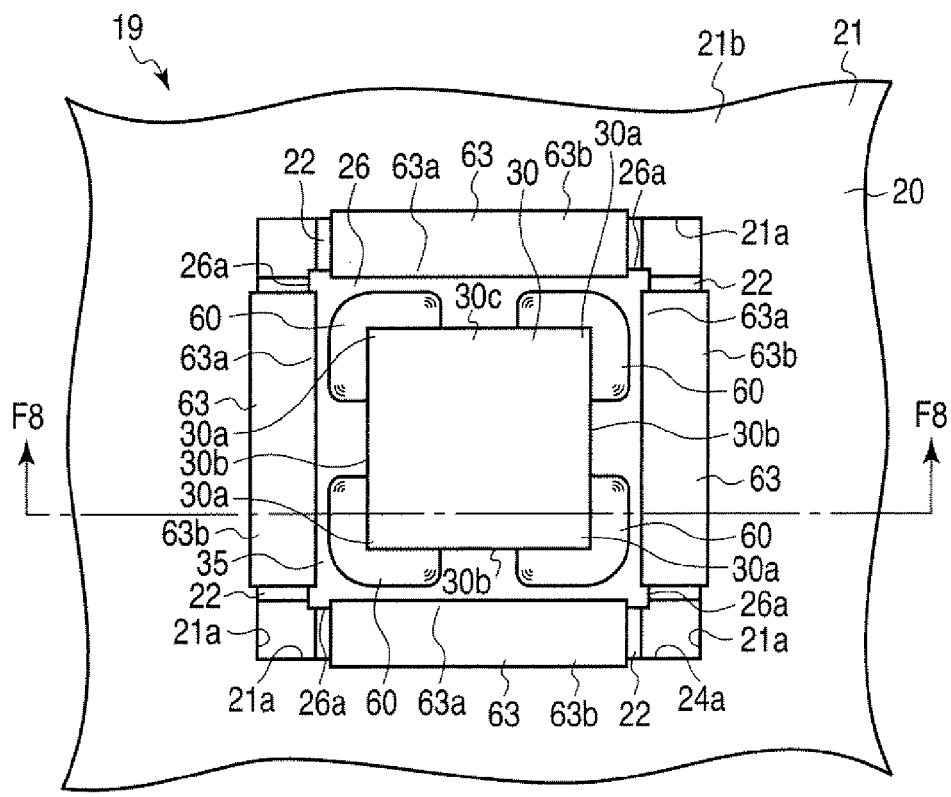
F I G. 7
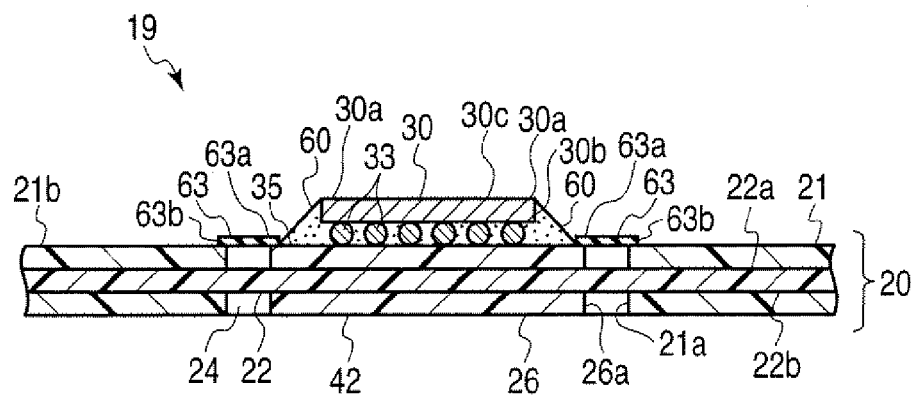
F I G. 8

ELECTRONIC DEVICE

CROSS-REFERENCE TO RELATED APPLICATIONS

This application is based upon and claims the benefit of priority from Japanese Patent Application No. 2009-156000, filed Jun. 30, 2009, the entire contents of which are incorporated herein by reference.

BACKGROUND

1. Field

One embodiment of the present invention relates to an electronic device, for example, comprising a circuit module in which a flexible printed circuit board is arranged around a rigid printed circuit board.

2. Description of the Related Art

Inside an electronic device such as a portable computer, a circuit module is housed and the module contains a rigid printed circuit board and various types of electronic parts mounted on the rigid printed circuit board. Portable electronic devices of this type may be exposed to percussive impact from outside while being carried in, for example, a bag.

When an electronic is exposed to percussive impact, the impact propagates to the circuit module inside the device. When the circuit module is exposed to percussive impact, the circuit module may be warped or distorted in form. For example, due to this, a defect may occur in the connection between a rigid printed circuit board and an electronic part, which was made by soldering.

In order to prevent such a defect, there have been provided such a technique in which an adhesive is supplied to be across between a side edge of the electronic part and the rigid printed circuit board, and thus the connection between the electronic part and the rigid printed circuit board is reinforced. There is another technique such as disclosed in, for example, Jpn. Pat. Appln. KOKAI Publication No. 2003-332743, in which the flexible printed circuit board (to be called as FPC hereinafter) is exposed to a portion of the rigid printed circuit board, and electronic parts are mounted on the FPC.

Even in the case where the connection between an electronic part and a rigid printed circuit board is reinforced with use of an adhesive, a large portion of the percussive impact applied to the electronic device is propagated to the circuit module. For this reason, some defect may occur in the connection due to the percussive impact even if an adhesive is employed.

In the technique of mounting electronic parts on an FPC, the electronic parts may not be firmly mounted since the FPC has flexibility. For this reason, even in the case where electronic parts are mounted on an FPC, some defect may occur in the connection due to the percussive impact.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 1 is an exemplary partially cut-away perspective view of a portable computer according to the first embodiment of the present invention;

FIG. 7 is an exemplary plan view showing a part of a circuit module of the third embodiment;

FIG. 8 is an exemplary cross sectional view taken along the line F8-F8 of FIG. 7;

DETAILED DESCRIPTION

Figure 2:
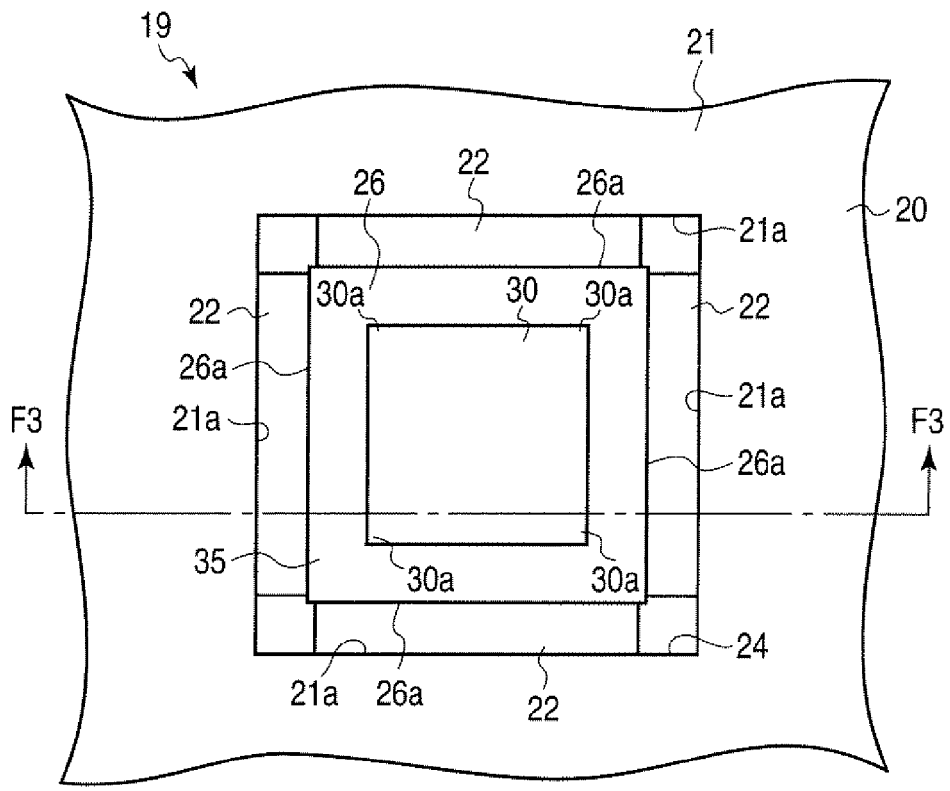
FIG. 2 is an exemplary plan view showing a part of a circuit module of the first embodiment.

Various embodiments according to the invention will be described hereinafter with reference to the accompanying drawings. In general, according to one embodiment of the invention, an electronic device includes a housing, a first substrate having rigidity and including a slit, contained in the housing, a part mount portion provided on the first substrate and adjacent to the slit, an electronic part mounted on the part mount portion and a second substrate having flexibility. The second substrate is stacked on an inside of the first substrate and an inside of the part mount portion, and it crosses the slit, thereby supporting the part mount portion to be displaceable with respect to the first substrate.

The first embodiment of the present invention will now be described with reference to FIGS. 1 to 4.

FIG. 1 shows an example of the electronic device, that is, a portable computer 1. The portable computer 1 includes a main body 2 of the computer and a display module 3.

The display module 3 is jointed to a rear end of the main body 2 via a pair of hinge portions 4. The display module 3 is made pivotable between a closed position where the module is lied on the main body 2 of the computer and an open position where the module stands upright from the rear end of the main body 2 around the hinge portions 4 as axis.

The main body 2 of the computer includes a housing 10 having a flat box shape. A keyboard mount portion 11 is formed on the upper surface of the housing 10. A keyboard 12 is supported on the keyboard mount portion 11.

The display module 3 includes a display housing 15 having a flat box shape, and a liquid crystal display panel 16 housed in the display housing 15. The liquid crystal display panel 16 includes a screen 16a. The screen 16a is exposed to the outside of the module display 3 through an opening 17 opened in the front surface of the display housing 15.

As shown in FIG. 1, the housing 10 contains a circuit module 19. The circuit module 19 comprises a module substrate 20. The module substrate 20 comprises a first substrate 21 and a second substrate 22. The first substrate 21 is the so-called rigid printed circuit board, which has solidity, whereas the second substrate 22 is the so-called flexible printed circuit board, which has flexibility.

A slit 24, which is a frame-shaped hole made through the first substrate 21 in its thickness direction, is made in the first substrate 21. With the slit 24 formed therein, a rectangular mount substrate 26 is formed inside the first substrate 21.

The mount substrate 26 is an example of the part mount portion, and it has a solidity similar to that of the first substrate 21. The mount substrate 26 is surrounded by the slit 24, and is isolated from the first substrate 21. Further, the mount substrate 26 includes a first mount surface 35 and a second mount surface 42. The second mount surface 42 is located on an opposite side to the first mount surface 35.

A ball grid array (BGA) 30, which is an example of the electronic parts, is mounted on the first mount surface 35 of the mount substrate 26. The BGA 30 includes four corners 30*a*.

The BGA 30 includes a plurality of solder balls 33 arranged in matrix. The solder balls 33 are an example of connection terminals. The solder balls 33 are soldered to pads (not shown) provided in the first mount surface 35. Further, other electronic parts 31 such as a capacitor and a resistor are mounted on the first substrate 21 and the second mount surface 42 of the mount substrate 26.

Figure 3:
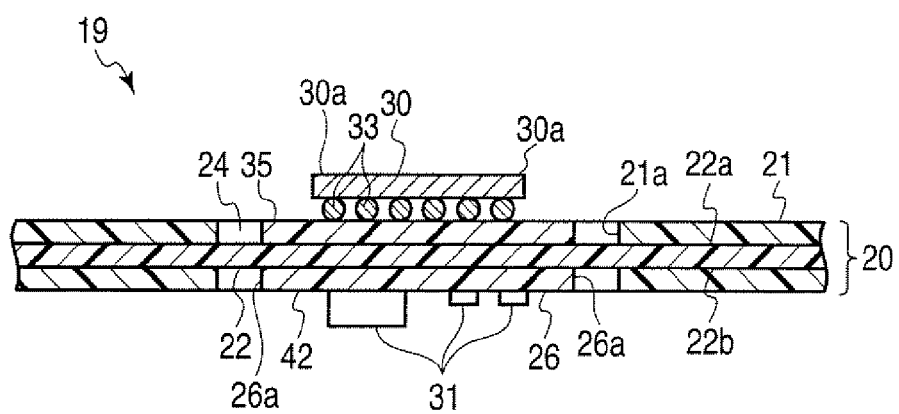
FIG. 3 is an exemplary cross sectional view taken along the line F3-F3 of FIG. 2.

As shown in FIG. 3, the second substrate 22 is laminated on the entire area inside the first substrate 21 and the entire area inside the mount substrate 26 such as to be across therebetween.

The second substrate 22 is provided to cross the slit 24 and to be across between the first substrate 21 and the mount substrate 26. In more detail, the second substrate 22 is provided from four side edges 26*a* of the rectangular mount substrate 26 to four side edges 21*a* of the first substrate 21 which defines the outer peripheral circumference of the slit 24. A portion of the second substrate 22 is exposed to the slit 24.

The second substrate 22 connects the first substrate 21 to the mount substrate 26. With this structure, the mount substrate 26 is held on substantially the same plane as that of the first substrate 21. Since the second substrate 22 has flexibility, the mount substrate 26 can be slightly displaced with reference to the first substrate 21. It should be noted that the second substrate 22 may be provided on the entire area of the slit 24.

Figure 4:
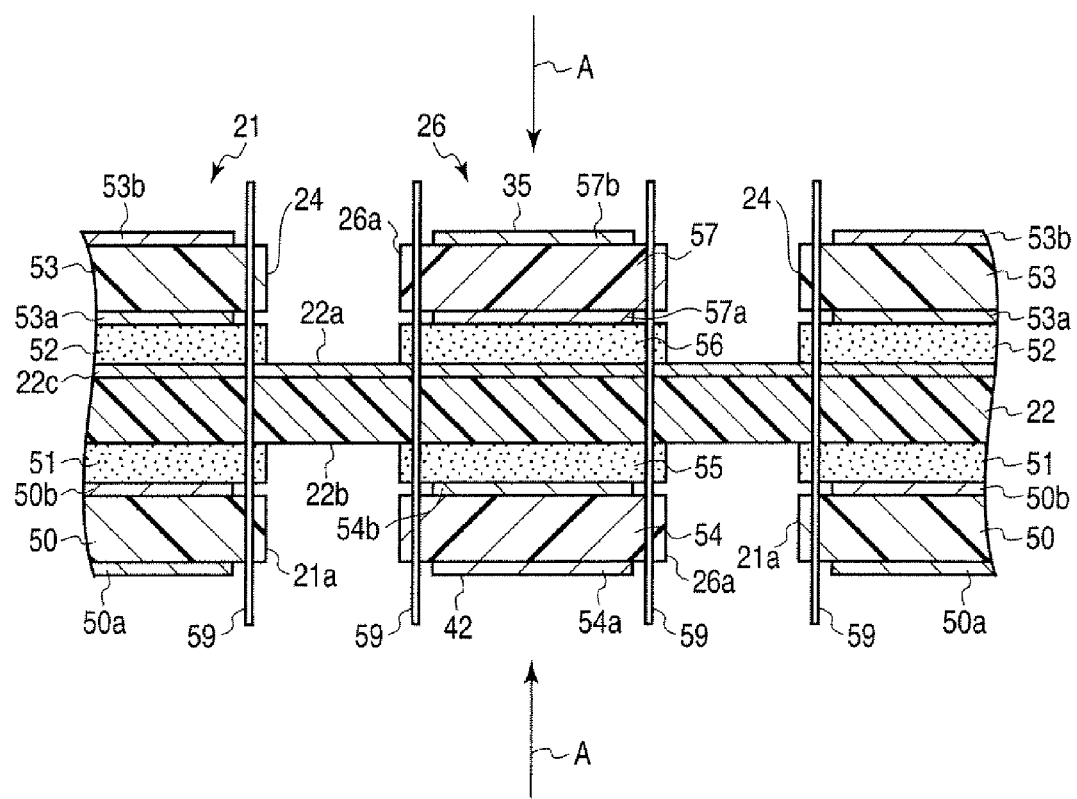
FIG. 4 is an exemplary cross sectional view showing a part of the circuit module before molding in the first embodiment.

FIG. 4 shows a multi-layered structure of the module substrate 20 before being molded. The first substrate 21 comprises a first pre-preg member 50, a first adhesive layer 51, a second adhesive layer 52 and a second pre-preg member 53.

The first pre-preg member 50 includes a conductor pattern 50*a* formed on one surface and a conductor pattern 50*b* formed on the other surface. The second pre-preg member 53 includes a conductor pattern 53*a* formed on one surface and a conductor pattern 53*b* formed on the other surface.

The mount substrate 26 comprises a third pre-preg member 54, a third adhesive layer 55, a fourth adhesive layer 56 and a fourth pre-preg member 57.

The third pre-preg member 54 includes a conductor pattern 54*a* formed on one surface and a conductor pattern 54*b* formed on the other surface. The fourth pre-preg member 57 includes a conductor pattern 57*a* formed on one surface and a conductor pattern 57*b* formed on the other surface.

The second substrate 22 is interposed between the first adhesive layer 51 and the second adhesive layer 52 of the first substrate 21, and also between the third adhesive layer 55 and the fourth adhesive layer 56 of the mount substrate 26.

Further, the second substrate 22 includes a first surface 22*a* and a second surface 22*b* located on an opposite side to the first surface 22*a*. A conductor pattern 22*c* is formed on the first surface 22*a* of the second substrate 22, and the conductor pattern 22*c* is electrically connected to the pads formed on the mount substrate 26.

Next, the method of manufacturing the module substrate 20 will now be described.

The second adhesive layer 52, the second pre-preg member 53, the fourth adhesive layer 56 and the fourth pre-preg member 57 are overlaid on the first surface 22*a* of the second substrate 22. Then, the first adhesive layer 51, the first pre-preg member 50, the third adhesive layer 55 and the third pre-preg member 54 are overlaid on the second surface 22*b* of the second substrate 22.

A plurality of guide pins 59 are inserted to holes, respectively, formed in the first pre-preg member 50, the first adhesive layer 51, the second substrate 22, the second adhesive layer 52 and the second pre-preg member 53 for alignment. With the guide pins 59, the first pre-preg member 50, the first adhesive layer 51, the second substrate 22, the second adhesive layer 52 and the second pre-preg member 53 are overlaid on one another while maintaining predetermined relative positions with each other.

A plurality of guide pins 59 are inserted to holes, respectively, formed in the third pre-preg member 54, the third adhesive layer 55, the second substrate 22, the fourth adhesive layer 56 and the fourth pre-preg member 57 for alignment. With the guide pins 59, the third pre-preg member 54, the third adhesive layer 55, the second substrate 22, the fourth adhesive layer 56 and the fourth pre-preg member 57 are overlaid on one another while maintaining predetermined relative positions with each other.

After carrying out the alignment as above, all the guide pins 59 are removed. Then, while maintaining the alignment, the first to fourth pre-preg members 50, 53, 54 and 57, the first to fourth adhesive layers 51, 52, 55 and 56 and the second substrate 22 are heated, and are also pressurized in the directed indicated by arrow A in FIG. 4. After that, through various steps including the formation of through holes, a module substrate 20 as shown in FIG. 3 is formed.

It should be noted that the method of manufacturing the module substrate 20 is not limited to that described above. For example, it is alternatively possible to overlay the first to fourth pre-preg members 50, 53, 54 and 57 and the first to fourth adhesive layers 51, 52, 55 and 56 onto the second substrate 22 after inserting the guide pins 59 into the holes made in the second substrate 22.

Next, the advantage of the portable computer 1 having the above-described structure will now be described.

Since the second substrate 22, which has flexibility, supports the mount substrate 26, the mount substrate 26 can be slightly displaced with respect to the first substrate 21. With this structure, a possible percussive impact applied on the BGA 30, which may be created when a percussive impact is applied to the portable computer and the impact is propagated to the circuit module 19, can be relaxed.

More specifically, as the mount substrate 26 flexibly moves to follow the percussive impact applied thereto, the impact propagated to the BGA 30 can be relaxed. In this manner, it is possible to prevent a defect in the electric connection between the mount substrate 26 and the BGA 30. With this structure, in particular, the stress applied to the corner portions 30*a* of the BGA 30, which is one of the main factors for a failure, can be relaxed. Therefore, a defect in the electric connection between the mount substrate 26 and the BGA 30 can be effectively prevented.

Further, in case where the module substrate 20 of the circuit module 19 is expanded due to heat, the second substrate 22 is warped by the expanded first substrate 21 and the expanded mount substrate 26. In this manner, the stress applied on the mount substrate 26 and the BGA 30 can be relaxed. Therefore, a defect in the electric connection between the mount substrate 26 and the BGA 30 caused by thermal expansion can be effectively prevented.

Further, the first substrate 21 and the mount substrate 26 are connected to each other via the second substrate 22, which is a flexible printed circuit board. With this structure, if such a structure as of this embodiment that can relax the possible impact applied on the BGA 30, the degree of freedom in the circuit design of the circuit module 19 can be retained.

In addition, the other electronic parts 31 can be mounted on the second mount surface 42 of the mount substrate 26 which is located on the opposite side to the BGA 30. With this structure, the packaging degree of the circuit module 19 can be increased.

Next, the second to fifth embodiments of the present invention will now be described with reference to the respective drawings. In these embodiments, structural parts which have the same functions as those of the portable computer 1 of the first embodiment will be designated by the same reference numerals, and the explanations therefore will be omitted.

Figure 5:
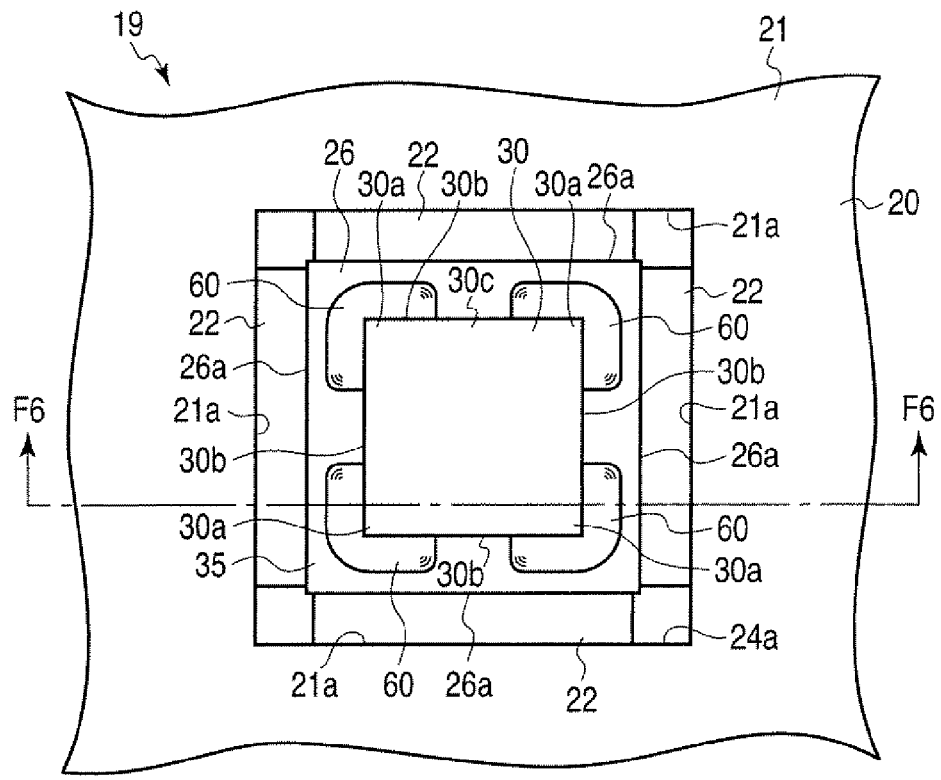
FIG. 5 is an exemplary plan view showing a part of a circuit module of the second embodiment.
Figure 6:
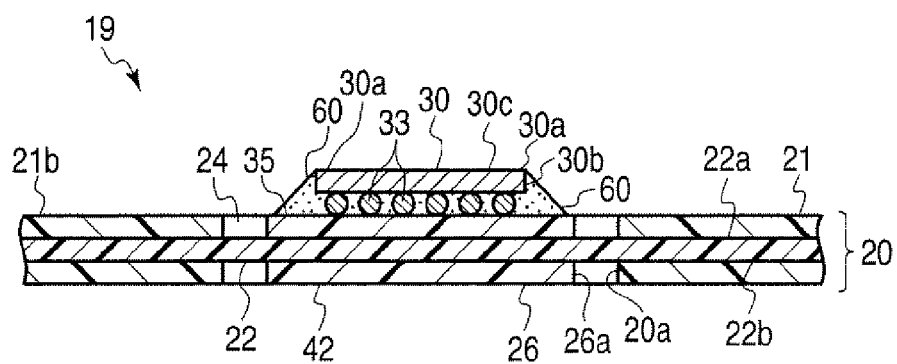
FIG. 6 is an exemplary cross sectional view taken along the line F6-F6 of FIG. 5.

FIGS. 5 and 6 show the second embodiment of the present invention.

As shown in FIG. 5, a reinforcing portion 60 is provided at each of the corner portions 30a of the BGA 30. The reinforcing portions 60 are each made of a thermosetting adhesive filled between the BGA 30 and the mount substrate 26 such as to be across therebetween.

In more detail, as shown in FIG. 6, the reinforcing portions 60 are made from the side edges 30b of the BGA 30 over to the first mount surface 35 of the mount substrate 25 to adhere each of them. The reinforcing portions 60 harden in the state which they adhere to the BGA 30 and the first mount surface 35, and in this manner, they fixate the BGA 30 to the mount substrate 26. It should be noted that the reinforcing portions 60 are formed even over to the upper surface 30c of the BGA 30.

In the portable computer 1 having the above-described structure, the reinforcing portions 60 fixate the BGA 30 to the mount substrate 26, and thus the soldered portion between the BGA 30 and the mount substrate 26 is reinforced. With this structure, a possible defect of the electrical connection between the BGA 30 and the mount substrate 26 can be prevented even more effectively.

It should be noted that the adhesive which forms the reinforcing portions 60 is not limited to the thermosetting type, but it is alternatively possible to use some other type of adhesive, for example, one which is hardened by ultraviolet rays or hardens along with an elapse of time.

Next, the third embodiment of the present invention will now be described with reference to FIGS. 7 and 8.

As shown in FIG. 7, a plurality of shock absorbing members 63 are provided between the first substrate 21 and the mount substrate 26 to be across therebetween. Each of the shock absorbing members 63 is formed of, for example, a sheet-like gel which transforms kinetic energy into heat. When kinetic energy is applied to the shock absorbing members 63, these members attenuate the kinetic energy by transforming it into heat.

As shown in FIG. 8, each of the shock absorbing members 63 is adhered to the first mount surface 35 of the mount substrate 26 by one end portion 63a thereof, and also to the upper surface 21b of the first substrate 21 by the other end portion 63b. With this structure, the shock absorbing members 63 cover a part of the slit 24.

It should be noted that the arrangement of the shock absorbing members 63 is not limited to that shown in FIG. 7, but it is alternatively possible to, for example, dispose the shock absorbing members 63 obliquely and connect the neighboring side edges 21a of the first substrate 21 to each other. Further, it is also possible to provide a single shock absorbing member 63 larger than the slit 24 such as to cover the first substrate 21, the slit 24 and the mount substrate 26.

Furthermore, the shock absorbing members 63 may be provided between the second mount surface 42 of the mount substrate 26 and the first substrate 21. In other words, it suffices only if the shock absorbing members 63 are formed between at least a part of the first substrate 21 and at least a part of the mount substrate 26 to be across therebetween.

In the portable computer 1 having the above-described structure, the shock absorbing members 63 are provided between the first substrate 21 and the mount substrate 26 to be across therebetween. If the circuit module 19 is exposed to percussive impact, the shock absorbing members 63 transform the kinetic energy caused by the impact into heat, thereby relaxing the impact propagated to the BGA 30. With this structure, a possible defect of the electrical connection between the BGA 30 and the mount substrate 26 can be prevented even more effectively.

Next, the fourth embodiment of the present invention will now be described with reference to FIG. 9.

Figure 9:
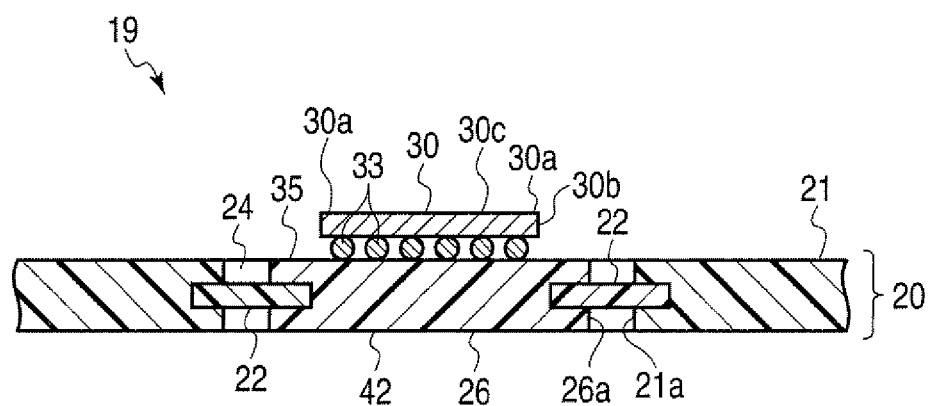
FIG. 9 is an exemplary cross sectional view showing a part of a circuit module according to the fourth embodiment.

As shown in FIG. 9, the flexible second substrate 22 is stacked on a portion inside the first substrate 21 and a portion inside the mount substrate 26, such as to cross the slit 24.

The portable computer 1 having the above-described structure is different from that of the first embodiment only in the respect that the flexible second substrate 22 is provided on only a portion inside the first substrate 21 and only a portion inside the mount substrate 26. Therefore, the use of the flexible printed circuit board, which is more expansive than the adhesive layer, can be reduced, and therefore the product cost can be decreased.

Figure 10:
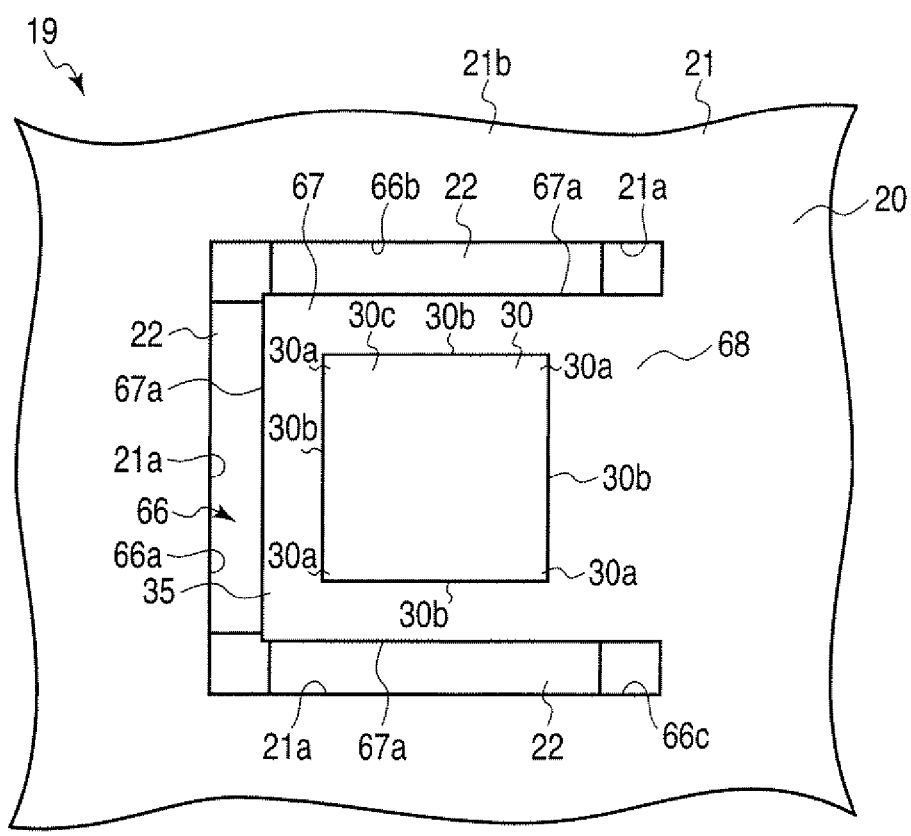
FIG. 10 is an exemplary plan view showing a part of a circuit module of the fifth embodiment.

Next, the fifth embodiment of the present invention will now be described with reference to FIG. 10.

The first substrate 21 comprises a slit 66 and a part mount portion 67. The slit 66 is a hole made through the first substrate 21 in its thickness direction, and it includes first to third portions 66a, 66b and 66c each formed in a liner shape.

The second portion 66b extends from an end of the first portion 66a in a direction normally crosses the first portion 66a. The third portion 66c extends from the other end of the first portion 66a in a direction normally crosses the first portion 66a. With this structure, the second portion 66b and the third portion 66c are arranged to be in parallel with each other with an interval therebetween.

The part mount portion 67 is defined by a region surrounded by the first to third portions 66a, 66b and 66c of the slit 66 from three directions, and it has a rectangular cantilever shape. The BGA 30 is mounted in the part mount portion 67.

The second substrate 22 is provided to cross the first to third portions 66a, 66b and 66c of the slit 66. In more detail, the second substrate 22 is provided from three side edges 67a of the part mount portion 67 to the side edges 21a of the first substrate 21, which respectively face the side edges 67a such be across therebetween, and a part of the second substrate 22 is exposed to the slit 66. It should be noted that the second substrate 22 may be provided on the entire area of the slit 66.

The part mount portion 67 is connected to the first substrate 21 via a continuation portion 68. Since the second substrate 22 has flexibility, the part mount potion 67 can be slightly displaced with respect to the first substrate 21 at the continuation portion 68 as a supporting point.

In the portable computer 1 having the above-described structure, the second substrate 22 has flexibility, and therefore the part mount potion 67 can be slightly displaced with respect to the first substrate 21 at the continuation portion 68 as a supporting point. With this structure, if the portable computer 1 is exposed to a percussive impact, and the impact is propagated to the circuit module 19, the impact applied to the BGA 30 can be relaxed.

More specifically, as the part mount portion 67 flexibly moves to follow the percussive impact applied thereto, the impact propagated to the BGA 30 can be relaxed. In this manner, it is possible to prevent a defect in the electric connection between the part mount portion 67 and the EGA 30. With this structure, in particular, the stress applied to the corner portions 30a of the BGA 30, which is one of the main factors for a failure, can be relaxed. Therefore, a defect in the electric connection between the part mount portion 67 and the BGA 30 can be effectively prevented.

Further, in case where the circuit module 19 is expanded due to heat, the second substrate 22 is warped by the expanded first substrate 21 and the expanded the part mount portion 67. In this manner, the stress applied on the part mount portion 67 and the BGA 30 can be relaxed. Therefore, a defect in the electric connection between the part mount portion 67 and the BGA 30 caused by thermal expansion can be effectively prevented.

Further, the first substrate 21 and the part mount portion 67 are connected to each other via the continuation portion 68 and also the second substrate 22, which is a flexible printed circuit board. With this structure, if such a structure as of this embodiment that can relax the possible impact applied on the BGA 30, the degree of freedom in the circuit design of the circuit module 19 can be retained.

It should be noted that the shapes of the slit and the part mount portion are not limited to those described above. For example, it is alternatively possible to provide two slits extending in parallel with each other in the first substrate, and define the region interposed between the two slits as the part mount portion. Or it is also possible to provide a slit including a linear portion and another portion extending from one end of the linear portion in a direction normally crossing the portion in the first substrate and define the rectangular region adjacent to this slit as the part mount portion.

Moreover, in the first to fifth embodiments, the BGA is discussed as an example of the electronic parts, but some other type of electronic part may be applied. For example, an electronic part such as a pin grid array (PGA) which includes pin-like connection terminals, or a quad flat package (QFP) including connection terminals extending towards a lateral direction can be used.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such farms or modifications as would fall within the scope and spirit of the inventions.

What is claimed is:

1. An electronic device comprising: a housing; a first planar substrate having rigidity and including a plurality of slits, the first planar substrate contained in the housing; a part mount portion provided on the first planar substrate and surrounded by the plurality of slits; an electronic part mounted on the part mount portion; a second substrate having flexibility, the second substrate being stacked in an inside of the first planar substrate and in an inside of the part mount portion and crossing at least one of the plurality slits to support the part mount portion to be displaceable with respect to the first planar substrate; and a shock absorbing material formed to be sheet-like, the shock absorbing material provided between at least a portion of the first planar substrate and at least a portion of the part mount portion, wherein the shock absorbing material covers a portion of the plurality of slits, the plurality of slits penetrate the first planar substrate in its thickness direction, and the second substrate is stacked to be extended over all of the first planar substrate and the part mount portion.

2. The electronic device of claim 1, wherein the shock absorbing material attenuates kinetic energy by transforming the kinetic energy into heat.

* * * * *